United States Patent [19]
Psyk et al.

[11] Patent Number: 6,013,870
[45] Date of Patent: Jan. 11, 2000

[54] THIN-FILM SOLAR MODULE

[75] Inventors: Walter Psyk, Munich; Peter Lechner, Vaterstetten, both of Germany

[73] Assignee: Angewandte Solarenergie—ASE GmbH, Alzenau, Germany

[21] Appl. No.: 09/232,887

[22] Filed: Jan. 15, 1999

[30]  Foreign Application Priority Data

Jan. 29, 1998 [DE] Germany .................. 198 03 326

[51] Int. Cl.[7] ............... H01L 27/142; H01L 31/042; H01L 31/05
[52] U.S. Cl. ............. 136/249; 136/244; 136/256; 257/448; 257/431; 257/443
[58] Field of Search .............. 136/244, 249 TS, 136/256; 257/443, 448, 431

[56]  References Cited

U.S. PATENT DOCUMENTS

| | | | |
|---|---|---|---|
| 4,638,109 | 1/1987 | Ishihara et al. | 136/244 |
| 4,933,022 | 6/1990 | Swanson | 136/249 |
| 5,041,391 | 8/1991 | Ono | 438/80 |
| 5,248,346 | 9/1993 | Fraas et al. | 136/244 |
| 5,616,185 | 4/1997 | Kukulka | 136/244 |

FOREIGN PATENT DOCUMENTS

| | | |
|---|---|---|
| 0 427 934 | 5/1991 | European Pat. Off. . |
| 0 768 720 | 4/1997 | European Pat. Off. . |
| 2 639 475 | 5/1990 | France . |
| 35 17 414 | 11/1985 | Germany . |
| 40 39 945 | 6/1992 | Germany . |
| 63-228766 | 9/1988 | Japan . |
| 9 064397 | 3/1997 | Japan . |

OTHER PUBLICATIONS

Patent Abstracts of Japan, Abstract for JP 2–298,080, Feb. 1991.

*Primary Examiner*—Alan Diamond
*Attorney, Agent, or Firm*—Flynn, Thiel, Boutell & Tanis, P.C.

[57]  ABSTRACT

This solar module in integrated thin-film technology consists of a number of solar cells 11, 12, 13, 14 tandem mounted and series-connected on common substrate 1 and a number of diodes 21, 22, 23, 24 disposed parallel and adjacent thereto. Overlap zones 10, 20 are formed by a projecting edge area of electrode layer 2, 4 of a solar cell or diode engaging a recess in the corresponding electrode layer of the adjacent diode or solar cell. Each diode is connected in the reverse direction with the adjacent solar cell in at least two overlap zones, i.e. front electrode layer 2 of the diode with back electrode layer 4 of the solar cell in at least one of said overlap zones 10, and back electrode layer 4 of the diode with front electrode layer 2 of the solar cell in at least one other overlap zone 20.

5 Claims, 4 Drawing Sheets

THIN-FILM SOLAR MODULE

FIELD OF THE INVENTION

This invention relates to a solar module having integrated thin-film technology.

BACKGROUND OF THE INVENTION

A solar module is known from DE 4039945 C2 . Here a number of tandem mounted, series-connected solar cells and a number of likewise tandem mounted, series-connected diodes parallel and adjacent thereto are applied to a common substrate. The diodes, like the solar cells, consist of a front and a back electrode layer and an intermediate photovoltaically active layer sequence. The series connection of the solar cells, on the one hand, and the diodes, on the other, is effected in the known solar module in the usual way by directly electrically contacting the front electrode layer of a solar cell or diode with the back electrode layer of the directly adjacent solar cell or diode. This is done by laterally leading through the particular electrode layers beyond the area of the intermediate photovoltaically active layer sequence. The series-connected solar cells, on the one hand, and the series-connected diodes, on the other, are separated from each other by a continuous groove, except for common front electrode layers of the two outermost solar cells and diodes. The totality of series-connected solar cells is thus connected in parallel with the totality of series-connected diodes.

However, the known solar module cannot optimally handle a frequently occurring problem, namely the risk of damage caused by partial shadowing of the solar module. If even one solar cell is shadowed, which can easily happen through the shadow cast e.g. by a frame when solar radiation falls obliquely on the edge of the module, the generated photocurrent of the solar module is limited by the much smaller photocurrent of the one shadowed solar cell. Simultaneously, a high voltage applied in the reverse direction forms on the shadowed solar cell, which can lead to an electric breakdown of this solar cell and irreversible damage thereto.

In order to prevent this phenomenon in optimal fashion, a diode must be connected in the reverse direction to each individual solar cell. This is not the case in the known solar module because it has a series connection of diodes in parallel with the series-connected solar cells, and not even in the reverse direction.

It is known in the art to tackle the shadowing problem by assigning to the individual solar cells diodes connected in the reverse direction. The corresponding version depicted in FIG. 5 of DE 3517414 A1 involves separate solar cells which are connected in series with each other by external wiring. Each of these solar cells has its own diode assigned thereto which is located on the same single substrate as this solar cell and also has substantially the same layer structure, but which belongs electrically to the adjacent solar cell and is connected in the reverse direction thereto via an external wiring. The total structure of this known version is evidently elaborate, however, since each individual solar cell is structurally integrated with one diode but no total module produced in integrated thin-film technology is involved.

The further known version depicted in FIGS. 1 and 2 of JP 63-228766 A involves series-connected thin-film p-i-n type solar cells of amorphous silicon to which diodes are assigned connected in parallel and in series. Solar cells and diodes are arranged one on the other, the diodes having the function of preventing a power loss possibly occurring through elevated series resistance of the cell when shadowed. The diodes are realized by a second production process with a reverse deposition sequence (n-i-p) over the actual solar cell. This method additionally requires metalization and several structuring steps after the two separate depositions for the solar cell and the diode in each case. The total structure of this version is evidently complicated and obviously difficult to control in terms of process technology.

SUMMARY OF THE INVENTION

The invention is based on the problem of providing a solar module of the abovementioned kind which can be produced in integrated thin-film technology and has a diode connected in the reverse direction for each individual solar cell.

It is thus first provided that the front and back electrode layers of adjacent diodes are not directly electrically contacted with each other, as is the case in the solar module of DE 4039945 C2. This eliminates the direct series connection of the diodes. Further, overlap zones are formed by a projecting edge area of an electrode layer of a solar cell or diode engaging a recess in the corresponding electrode layer of the adjacent diode or solar cell and thus overlapping the superjacent or subjacent zone of the other electrode layer of this adjacent diode or solar cell. Finally, each diode is connected in the reverse direction with the adjacent solar cell in at least two such overlap zones, the front electrode layer of the particular diode being electrically contacted with the back electrode layer of the particular solar cell in at least one of these overlap zones, and the back electrode layer of this diode with the front electrode layer of this solar cell in at least one other of these overlap zones.

The abovementioned overlap zones can be produced in simple, timesaving and cost-effective fashion by corresponding structuring of the particular electrode layers in the course of the integrated industrial process, as will become clearer below with reference to the embodiment. The contacting in these overlap areas also ensures firstly that each individual solar cell has assigned thereto a diode connected in the reverse direction thereto. Secondly, it causes the diodes to be series-connected altogether but in the reverse direction to the solar cells. While the series connection of the solar cells is effected directly in the usual way, i.e. by contacting the front electrode layer of a solar cell with the back electrode layer of the adjacent cell, the series connection of the diodes is effected by indirect means via the overlap zones and the electrode layers of the assigned solar cells.

BRIEF DESCRIPTION OF THE DRAWINGS

In the following, an embodiment of the invention will be explained in more detail with reference to the schematic figures, in which.

DETAILED DESCRIPTION

Figure 2:
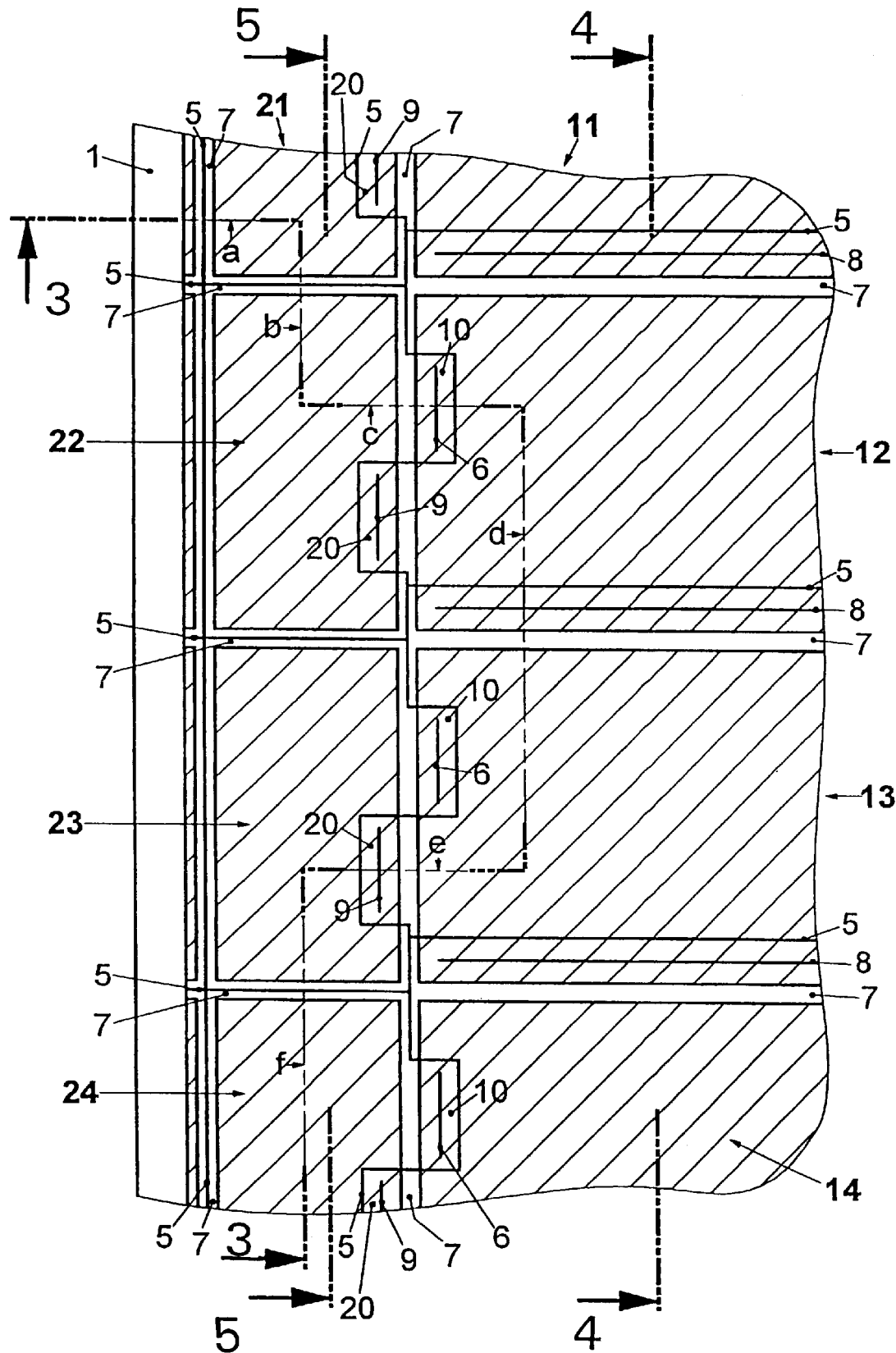
FIG. 2 shows part of the solar module in a plan view.

The plan view of FIG. 2 shows a detail of a solar module according to the invention, with solar cells 11, 12, 13 and 14 and diodes 21, 22, 23 and 24. One sees substantially the structuring of the particular front and back electrode layers. This is done by a first system of grooves 5 and by a second system of grooves 7. For clarity's sake grooves 5 are shown only as thick unbroken lines, unlike grooves 7. The back electrode layers structured by grooves 7 are obliquely hatched. Grooves 5 are directed so as to form projecting edge areas and recesses in the front electrode layers of the solar cells and diodes, resulting in overlap zones 10, 20 in which said projecting edge areas come to lie under the superjacent edge zones of back electrode layers. One also sees grooves 8 as well as 6 and 9 which are for the electric contacting of overlapping electrode layers, said contacting being done through the photovoltaically active layer sequence located between the electrode layers (and not explicitly shown in FIG. 2), as indicated in detail by the sectional views of FIGS. 3 to 5.

Figure 4:
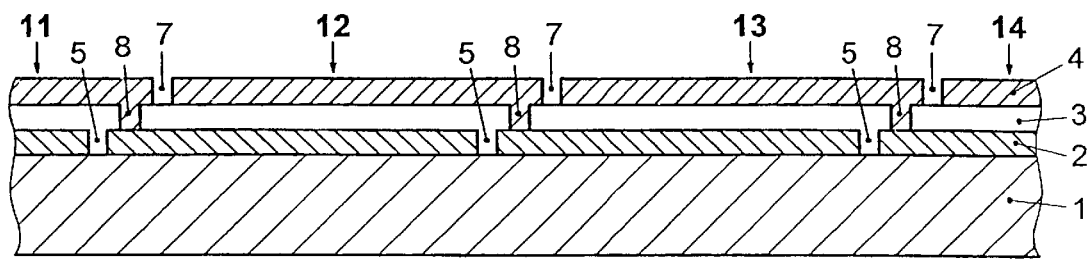
FIG. 4 shows a second section along cutting line 4—4 of FIG. 2.

FIG. 4 first shows a section only through solar cells 11, 12, 13 and 14. Said cells are connected in series in integrated fashion as usual. On substrate 1, which is transparent in this embodiment, for example a glass wafer, front electrode layers 2 structured by grooves 5 are first applied. Located thereon is continuous photovoltaically active layer sequence 3 in which individual grooves 8 are cut for the series connection. Back electrode layers 4 separated from each other by grooves 7 are located on photovoltaically active layer sequence 3, the material of back electrode layers 4 extending in grooves 8 down to the surface of front electrode layers 2 and thus effecting the electric contacting necessary for the series connection. The photovoltaically active layer sequence can be executed for example as a p-i-n structure based on amorphous silicon, but one can also use any other material or layer sequence usual in solar cell technology which is suitable for producing and separating electric charges upon incidence of light. As front electrode layer 2 one expediently uses a transparent conductive oxide layer, consisting for example of stannic oxide; as back electrode layer 4 a highly electroconductive, nontransparent metal layer which can also consist of a plurality of superimposed sublayers each of a different material.

Figure 5:
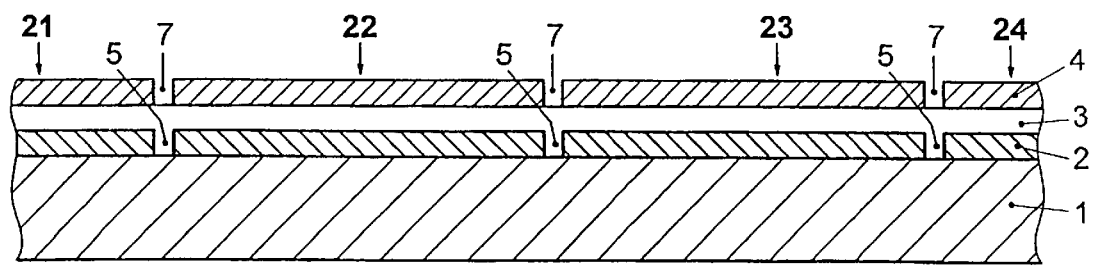
FIG. 5 shows a third section along cutting line 5—5 of FIG. 2, and FIGS. 6, 7 and 8 show three different versions of overlap zones.

The section shown in FIG. 5 goes through tandem mounted diodes 21, 22, 23 and 24. Like the solar cells, said diodes also consist of front electrode layers 2, back electrode layers 4 and the abovementioned intermediate, continuous, photo-voltaically active layer sequence 3. The latter engages grooves 5, which are no longer shown here only as lines as in FIG. 2 but with a certain width. Grooves 7 located there-above have the same width as grooves 5 in FIG. 5, but this need not necessarily be the case. The two groove systems cause diodes 21, 22, 23 and 24 to be virtually insulated electrically from each other, at least in the cutting plane shown, since intermediate photovoltaically active layer sequence 3 has very low electric conductivity and can be regarded as electrically insulating in the present context. In case of insufficient insulation, photovoltaically active layer sequence 3 can likewise be separated by a groove.

Figure 3:
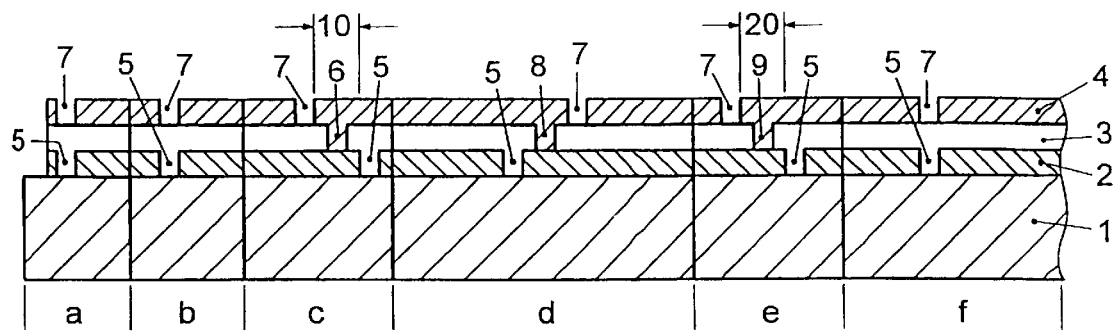
FIG. 3 shows a first cross section through this part of the solar module along cutting line 3—3 of FIG. 2.

FIG. 3 shows a bent cross section according to line 3—3 in FIG. 2, being divided into altogether six portions a to f each of which is straight. The designations are selected as in FIGS. 4 and 5. Portions b and f correspond to partial sections from FIG. 5, portion d to a partial section from FIG. 4. Portions c and e go through overlap zones 10 and 20, respectively. In the first (10) of these overlap zones a projecting edge area of front electrode layer 2 of diode 22 is located under an edge zone of back electrode layer 4 of assigned solar cell 12. Groove 6 is present in which the material of back electrode layer 4 of solar cell 12 extends through photovoltaically active layer sequence 3 down to the surface of the subjacent edge area of front electrode layer 2 of diode 22 so that said two electrode layers are electrically contacted with each other there. A similar situation is found in sectional area e, where one sees overlap zone 20 formed in this case by a projecting edge area of front electrode layer 2 of solar cell 13 and the superjacent edge zone of back electrode layer 4 of diode 23. Groove 9 in intermediate photovoltaically active layer sequence 3 ensures the contacting between said two layers, by means of the material of back electrode layer 4 of diode 23 extending in said groove down to the surface of front electrode layer 2 of solar cell 13.

Figure 1:
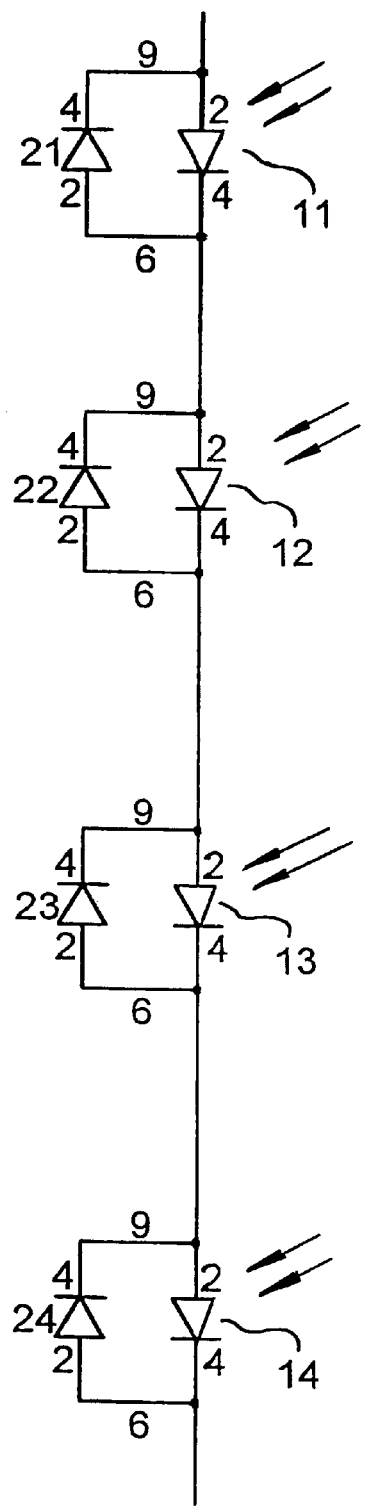
FIG. 1 shows an equivalent circuit diagram of part of the solar module.

The equivalent circuit diagram of FIG. 1 shows, along with solar cells 11 to 14 and diodes 21 to 24, corresponding front and back electrode layers 2, 4 which are contacted with each other in grooves 6 and 9 of said transition zones 10, 20 not shown here. The series connection of solar cells 11 to 14 and indirectly also of diodes 21 to 24 is effected via grooves 8, as mentioned above.

Figure 6:
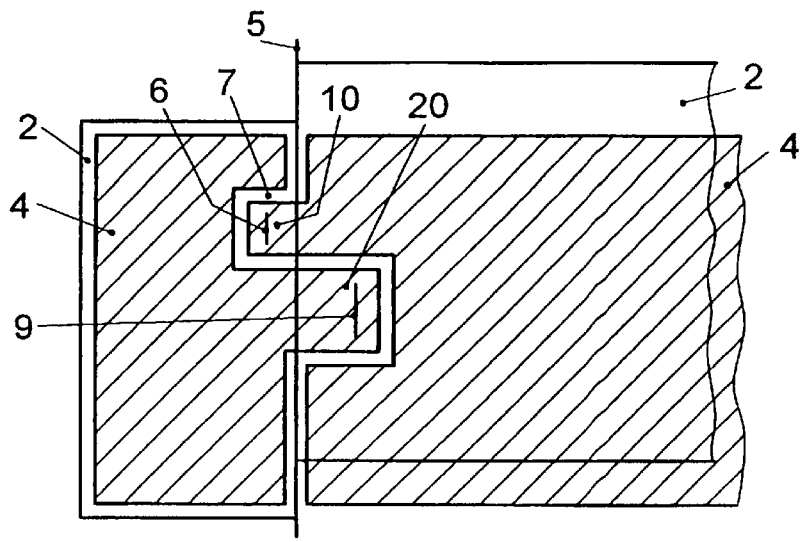
Figure 7:
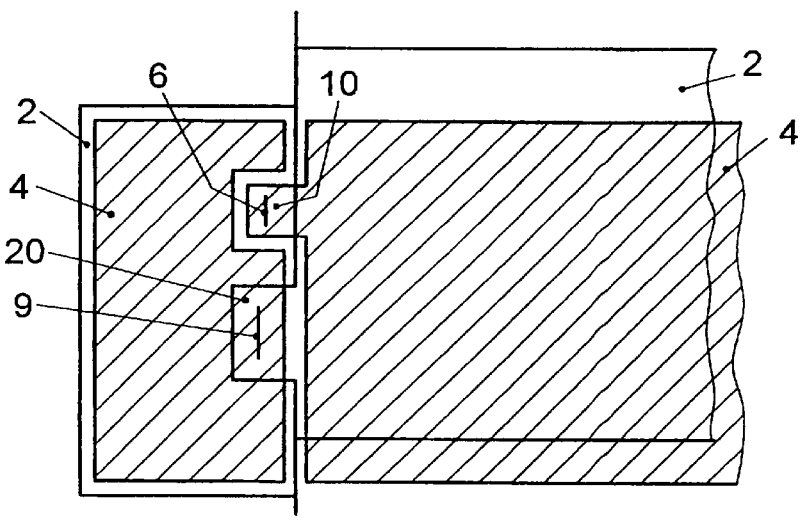
Figure 8:
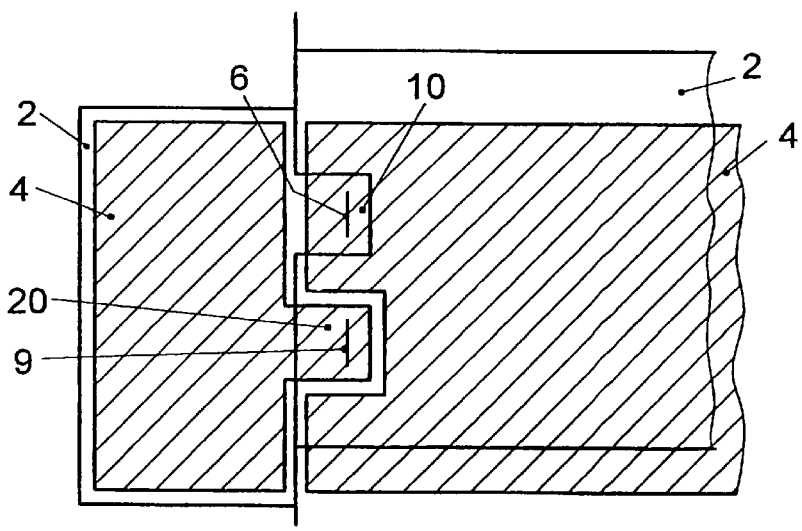

FIGS. 6 to 8 show some variants in the design of transition zones 10 and 20. While overlap zones 10 and 20 are formed by projecting edge areas and recesses in the front electrode layers of the correlated solar cells and diodes in the variant depicted in FIG. 2, this is done for example according to FIG. 6 by projecting edge areas in back electrode layers 4. These two embodiments therefore have in common that both one and the other of transition zones 10 and 20 of a diode and the adjacent solar cell are formed by projecting edge areas and recesses in the matching electrode layers, i.e. either the front or the back ones.

In the embodiment according to FIG. 7, transition zone 10 is formed by a projecting edge area of back electrode layer 4 of the solar cell, and transition zone 20 by a projecting edge area of front electrode layer 2 likewise of the solar cell. According to FIG. 8, this is done by projecting edge areas of the front and back electrode layers of only the diode. These two variants therefore have in common that one of the transition zones is formed by a projecting edge area and a recess in the front electrode layers, and the other of the transition zones by a projecting edge area and a recess in the back electrode layers of the involved diode and solar cell.

FIGS. 6 to 8 each show a pair consisting of a diode (on the left) and the assigned solar cell (on the right). As in FIG. 2, one sees front and back electrode layers 2, 4, the systems of grooves 5 and 7 separating said layers, and the at least necessary two overlap zones 10 and 20 with grooves 6, 9 present therein for contacting in the photovoltaically active layer sequence located between front and back electrode layers 2, 4, which is again not explicitly shown here. Likewise omitted from the drawing are grooves 8 for the series connection of adjacent solar cells.

We claim:

1. A solar cell module formed from integrated thin-film technology having a plurality of solar cells tandem mounted and series-connected on a common substrate and a plurality of diodes tandem mounted and series-connected on the common substrate parallel and adjacent to said solar cells, the solar cells and the diodes each having a front electrode layer, a back electrode layer and an intermediate photovoltaically active layer located between the front and back electrode layers, wherein:

the front and back electrode layers of adjacent diodes are not directly electrically contacted with each other, a plurality of overlap zones are formed by projecting edge areas of the electrode layers of the solar cells or diodes and, each overlap zone engages in a recess in the corresponding electrode layer of the adjacent diode or solar cell and thus overlapping a superjacent zone or a subjacent zone of the other electrode layer of said adjacent diode or solar cell, and each diode is connected in the reverse direction with the adjacent solar cell in at least two said overlap zones the front electrode layer of the diode being electrically connected with the back electrode layer of the adjacent solar cell in at least one of said overlap zones, and the back electrode layer of said diode being electrically connected with the front electrode layer of the adjacent solar cell in at least the other of said overlap zones.

2. The solar cell module of claim 1, wherein both said overlap zones, of at least one of said diodes and the adjacent solar cell are formed by projecting edge areas and recesses in the matching electrode layer.

3. The solar cell module of claim 1, wherein one of said overlap zones for at least one said diode and the adjacent solar cell is formed by a projecting edge area and a recess in the front electrode layers of the diode and the adjacent solar cell, and the other of the overlap zones for the diode and the adjacent solar cell is formed by a projecting edge area and a recess in the back electrode layers of the diode and the adjacent solar cell.

4. The solar cell module of claim 1, wherein the electrical contact between the front and the back electrode layers in said overlap zones is effected through openings formed in the photovoltaically active layer.

5. The solar cell module of claim 4, wherein for the electrical contact in the openings formed in the photovoltaically active layer is establish by segments of the back electrode layer that extend to and contact the front electrode layer.

* * * * *